United States Patent
Yamagishi et al.

(10) Patent No.: US 12,506,045 B2
(45) Date of Patent: Dec. 23, 2025

(54) SEMICONDUCTOR DEVICE

(71) Applicant: DENSO CORPORATION, Kariya (JP)

(72) Inventors: Tetsuto Yamagishi, Kariya (JP); Yoshitsugu Sakamoto, Kariya (JP); Ryoichi Kaizu, Kariya (JP); Yuki Inaba, Kariya (JP); Hiroki Yoshikawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 436 days.

(21) Appl. No.: 18/146,582

(22) Filed: Dec. 27, 2022

(65) Prior Publication Data
US 2023/0130647 A1   Apr. 27, 2023

Related U.S. Application Data

(63) Continuation of application No. PCT/JP2021/022462, filed on Jun. 14, 2021.

(30) Foreign Application Priority Data

Jul. 31, 2020 (JP) .................................. 2020-129952

(51) Int. Cl.
*B23K 35/26* (2006.01)
*C22C 13/02* (2006.01)
(Continued)

(52) U.S. Cl.
CPC ........ *H01L 23/3675* (2013.01); *B23K 35/262* (2013.01); *C22C 13/02* (2013.01);
(Continued)

(58) Field of Classification Search
CPC ................. H01L 23/3675; H01L 24/29; H01L 2224/29211; H01L 2224/29213; H01L 2224/2922; H01L 2224/29247; H01L 2224/29255; H01L 2224/29257; H01L 2924/01015; H01L 2924/01027;
(Continued)

(56) References Cited

U.S. PATENT DOCUMENTS

2017/0162482 A1* 6/2017 Kadoguchi ............. H01L 24/40
2019/0389012 A1   12/2019 Ribas et al.
(Continued)

FOREIGN PATENT DOCUMENTS

JP   2004-296837 A   10/2004

*Primary Examiner* — Dale E Page
*Assistant Examiner* — Daniel J Hibbert
(74) *Attorney, Agent, or Firm* — Posz Law Group, PLC (57) ABSTRACT

A semiconductor device includes a semiconductor chip having first and second main electrodes disposed on opposite surfaces of a silicon carbide substrate, first and second heat dissipation members disposed so as to sandwich the semiconductor chip, and joining members disposed between the first main electrode and the first heat dissipation member and between the second main electrode and the second heat dissipation member. At least one of the joining members is made of a lead-free solder having an alloy composition that contains 3.2 to 3.8 mass % Ag, 0.6 to 0.8 mass % Cu, 0.01 to 0.2 mass % Ni, x mass % Sb, y mass % Bi, 0.001 to 0.3 mass % Co, 0.001 to 0.2 mass % P, and a balance of Sn, where x and y satisfy relational expressions of $x+2y \leq 11$ mass %, $x+14y \leq 42$ mass %, and $x \geq 5.1$ mass %.

4 Claims, 7 Drawing Sheets

(51) Int. Cl.
*H01L 21/52* (2006.01)
*H01L 23/00* (2006.01)
*H01L 23/367* (2006.01)
*H01L 25/07* (2006.01)
*H01L 25/18* (2023.01)
*B23K 101/36* (2006.01)
*H02P 27/08* (2006.01)

(52) U.S. Cl.
CPC .......... *H01L 24/29* (2013.01); *B23K 2101/36* (2018.08); *H01L 2224/29211* (2013.01); *H01L 2224/29213* (2013.01); *H01L 2224/2922* (2013.01); *H01L 2224/29247* (2013.01); *H01L 2224/29255* (2013.01); *H01L 2224/29257* (2013.01); *H01L 2924/01015* (2013.01); *H01L 2924/01027* (2013.01); *H01L 2924/01028* (2013.01); *H01L 2924/01029* (2013.01); *H01L 2924/0105* (2013.01); *H01L 2924/01051* (2013.01); *H01L 2924/01083* (2013.01); *H01L 2924/014* (2013.01); *H01L 2924/10272* (2013.01); *H01L 2924/12032* (2013.01); *H01L 2924/13055* (2013.01); *H01L 2924/13091* (2013.01); *H02P 27/08* (2013.01)

(58) Field of Classification Search
CPC . H01L 2924/01028; H01L 2924/01029; H01L 2924/0105; H01L 2924/01051; H01L 2924/01083; H01L 2924/014; H01L 2924/10272; H01L 2924/12032; H01L 2924/13055; H01L 2924/13091; H01L 24/26; H01L 21/52; H01L 23/3735; H01L 23/49513; H01L 23/49537; H01L 23/49562; H01L 23/49568; H01L 23/49575; H01L 25/07; H01L 25/18; H01L 2224/0603; H01L 2224/32245; H01L 2224/48247; H01L 2224/73265; H01L 2924/181; B23K 35/262; B23K 2101/36; B23K 35/26; C22C 13/02; H02P 27/08

See application file for complete search history.

(56) References Cited

U.S. PATENT DOCUMENTS

2020/0266727 A1* 8/2020 Tsuchimochi ...... H01L 23/3735
2020/0306895 A1* 10/2020 Iijima ................ B23K 35/0244
2021/0233871 A1 7/2021 Kaizu et al.

* cited by examiner

SEMICONDUCTOR DEVICE

CROSS REFERENCE TO RELATED APPLICATIONS

The present application is a continuation application of International Patent Application No. PCT/JP2021/022462 filed on Jun. 14, 2021, which designated the U.S. and claims the benefit of priority from Japanese Patent Application No. 2020-129952 filed on Jul. 31, 2020. The entire disclosures of all of the above applications are incorporated herein by reference.

TECHNICAL FIELD

The present disclosure relates to a semiconductor device.

BACKGROUND

JP 2004-296837 A discloses a semiconductor device having a double-sided heat dissipation structure in which a semiconductor chip is sandwiched between heat dissipation members. The contents of JP 2004-296837 A are incorporated herein by reference to describe technical elements in the present disclosure.

SUMMARY

The present disclosure provides a semiconductor device including a semiconductor chip having first and second main electrodes disposed on opposite surfaces of a silicon carbide substrate, first and second heat dissipation members disposed so as to sandwich the semiconductor chip, and joining members disposed between the first main electrode and the first heat dissipation member and between the second main electrode and the second heat dissipation member. At least one of the joining members is made of a lead-free solder having an alloy composition that contains 3.2 to 3.8 mass % Ag, 0.6 to 0.8 mass % Cu, 0.01 to 0.2 mass % Ni, x mass % Sb, y mass % Bi, 0.001 to 0.3 mass % Co, 0.001 to 0.2 mass % P, and a balance of Sn, where x and y satisfy relational expressions of $x+2y \leq 11$ mass %, $x+14y \leq 42$ mass %, and $x \geq 5.1$ mass %.

BRIEF DESCRIPTION OF DRAWINGS

Objects, features and advantages of the present disclosure will become apparent from the following detailed description made with reference to the accompanying drawings. In the drawings.

DETAILED DESCRIPTION

Silicon carbide (SiC) has characteristics such as a large dielectric breakdown electric field, a large band gap, a high thermal conductivity, and a high electron saturation rate as compared with silicon (Si). However, the Young's modulus of SiC is approximately three times higher than that of Si. Therefore, when a SiC substrate is used as a semiconductor chip, a joining member and the semiconductor chip may crack or otherwise become damaged. From the above perspective or from an unmentioned perspective, the semiconductor device needs further improvement.

A semiconductor device according to an aspect of the present disclosure includes a semiconductor chip, a first heat dissipation member, a second heat dissipation member, and multiple joining members. The semiconductor chip includes a SiC substrate in which an element is formed, a first main electrode disposed on one surface of the SiC substrate, and a second main electrode disposed on a rear surface of the SiC substrate. The rear surface is positioned opposite the one surface in a plate thickness direction of the SiC substrate. The first heat dissipation member and the second heat dissipation member are disposed so as to sandwich the semiconductor chip. The first heat dissipation member is disposed toward the one surface and is connected to the first main electrode. The second heat dissipation member is disposed toward the rear surface and is connected to the second main electrode. The multiple joining members include a joining member disposed between the first main electrode and the first heat dissipation member and a joining member disposed between the second main electrode and the second heat dissipation member. At least one of the joining members is made of a lead-free solder having an alloy composition that contains 3.2 to 3.8 mass % Ag, 0.6 to 0.8 mass % Cu, 0.01 to 0.2 mass % Ni, x mass % Sb, y mass % Bi, 0.001 to 0.3 mass % Co, 0.001 to 0.2 mass % P, and a balance of Sn, where x and y satisfy relational expressions of $x+2y \leq 11$ mass %, $x+14y \leq 42$ mass %, and $x \geq 5.1$ mass %.

The lead-free solder having the above-described alloy composition has excellent creep resistance. Therefore, the lead-free solder having the above-described alloy composition is able to suppress the deformation of the semiconductor chip and thus increase the life of the semiconductor device. Further, even when thermal stress is applied based on linear expansion coefficient difference between the semiconductor chip and the heat dissipation members, the lead-free solder having the above-described alloy composition is able to maintain high connection reliability. Consequently, the lead-free solder having the above-described alloy composition is suitable for the semiconductor device having a double-sided heat dissipation structure in which a SiC substrate is used as the semiconductor chip.

Multiple embodiments will now be described with reference to the accompanying drawings. In the description of the embodiments, parts functionally and/or structurally corresponding to each other and/or parts associated with each other may be designated by the same reference numerals. As regards the corresponding parts and/or the associated parts, the description of the other embodiments may be referenced.

A semiconductor device according to the embodiments is applied, for example, to a power conversion device for a movable body that uses a dynamo-electric machine as a drive source. The movable body is, for example, an electrically driven vehicle, such as an electric vehicle (EV), a hybrid vehicle (HV), or a fuel cell vehicle (FCV), a flying vehicle such as a drone, a ship, a construction machine, or an agricultural machine. The following description deals with an example in which the semiconductor device is applied to a vehicle.

First Embodiment

Figure 1:
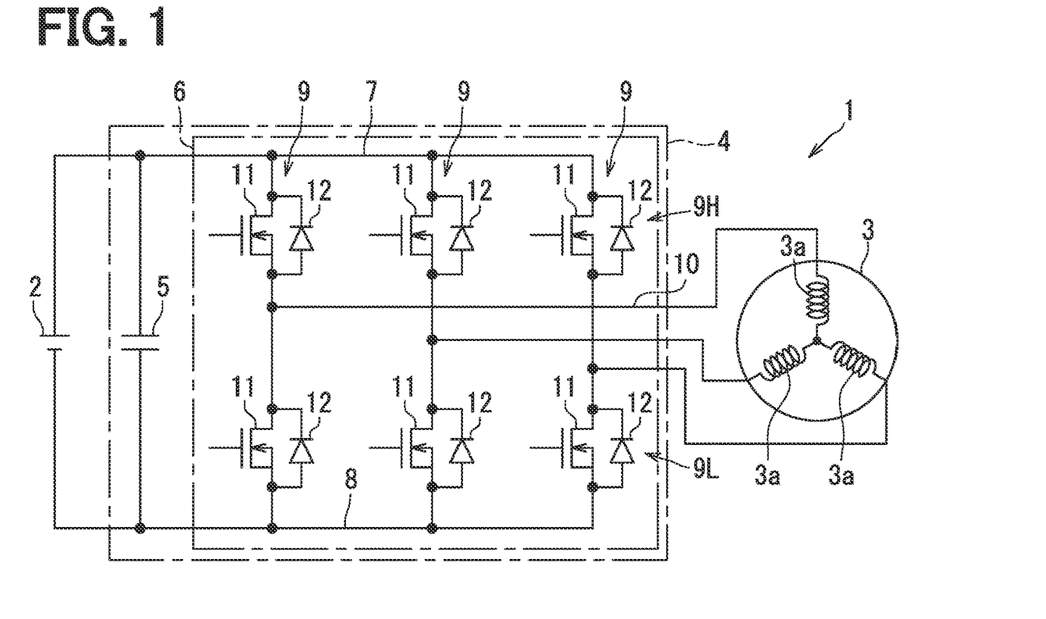
FIG. 1 is a schematic diagram illustrating a configuration of a vehicle drive system to which a semiconductor device according to a first embodiment is applied.

First, a configuration of a vehicle drive system 1 according to a first embodiment will be outlined with reference to FIG. 1.

<Vehicle Drive System>

As illustrated in FIG. 1, the vehicle drive system 1 includes a direct current (DC) power supply 2, a motor generator 3, and a power conversion device 4.

The DC power supply 2 is a DC voltage source that includes a rechargeable and dischargeable secondary battery. The secondary battery is, for example, a lithium-ion battery or a nickel-metal hydride battery. The motor generator 3 is a three-phase AC dynamo-electric machine. The motor generator 3 functions as a vehicle traveling drive source, that is, an electric motor. At the time of regeneration, the motor generator 3 functions as a power generator. The power conversion device 4 performs power conversion between the DC power supply 2 and the motor generator 3.

<Power Conversion Device>

A circuit configuration of the power conversion device 4 will now be described with reference to FIG. 1. The power conversion device 4 includes a smoothing capacitor 5 and an inverter 6.

The smoothing capacitor 5 mainly smooths a DC voltage that is supplied from the DC power supply 2. The smoothing capacitor 5 is connected to a P line 7 and to an N line 8. The P line 7 is a high-potential power line. The N line 8 is a low-potential power line. The P line 7 is connected to a positive electrode of the DC power supply 2, whereas the N line 8 is connected to a negative electrode of the DC power supply 2. A positive electrode of the smoothing capacitor 5 is connected to the P line 7 between the DC power supply 2 and the inverter 6. Similarly, a negative electrode of the smoothing capacitor 5 is connected to the N line 8 between the DC power supply 2 and the inverter 6. The smoothing capacitor 5 is connected in parallel to the DC power supply 2.

The inverter 6 is a DC-AC conversion circuit. In accordance with switching control executed by a control circuit which is not shown, the inverter 6 converts a DC voltage to a three-phase AC voltage, and outputs the three-phase AC voltage to the motor generator 3. The motor generator 3 is then driven to generate a predetermined torque. During regenerative braking of the vehicle, the inverter 6 converts a three-phase AC voltage, which is generated by the motor generator 3 upon receipt of a rotating force from wheels, to a DC voltage in accordance with switching control executed by the control circuit, and outputs the DC voltage to the P line 7. As described above, the inverter 6 performs bidirectional power conversion between the DC power supply 2 and the motor generator 3.

The inverter 6 includes an upper and lower arm circuit 9 for three phases. The upper and lower arm circuit 9 may be referred to as a leg. The upper and lower arm circuit 9 includes an upper arm 9H and a lower arm 9L. The arm upper 9H and the lower arm 9L are connected in series between the P line 7 and the N line 8 with the upper arm 9H positioned toward the P line 7. A connection point between the upper arm 9H and the lower arm 9L is connected to a winding 3a of a corresponding phase of the motor generator 3. The inverter 6 has six arms.

The six arms each include a metal-oxide-semiconductor field effect transistor (MOSFET) 11 and a diode 12. The MOSFET 11 is a switching element. For reflux, the diode 12 is connected in anti-parallel to the MOSFET 11. The diode 12 may be a parasitic diode (body diode) of the MOSFET 11 or may be provided separately from a parasitic diode.

The MOSFET 11 in the present embodiment is of an n-channel type. In the MOSFET 11, the drain is a high-potential main electrode, and the source is a low-potential main electrode. In the upper arm 9H, the drain is connected to the P line 7. In the lower arm 9L, the source is connected to the N line 8. The source toward the upper arm 9H and the drain toward the lower arm 9L are connected to each other. The anode of the diode 12 is connected to a corresponding source of the MOSFET 11, whereas the cathode of the diode 12 is connected to the drain of the MOSFET 11.

The power conversion device 4 may additionally include a converter as a power conversion circuit. The converter is a DC-DC conversion circuit for converting a DC voltage to a DC voltage having a different value. The converter is disposed between the DC power supply 2 and the smoothing capacitor 5. The converter includes, for example, a reactor and the upper and lower arm circuit 9 described above. The power conversion device 4 may include a filter capacitor for removing power supply noise from the DC power supply 2. The filter capacitor is disposed between the DC power supply 2 and the converter.

The power conversion device 4 may include a drive circuit for a switching element included, for example, in the inverter 6. In accordance with a drive command from the control circuit, the drive circuit supplies a drive voltage to the gate of the MOSFET 11 for a corresponding arm. In response to the application of the drive voltage, the drive circuit drives the corresponding MOSFET 11, that is, provides ON drive and OFF drive of the corresponding MOSFET 11. The drive circuit may be referred to as a driver.

The power conversion device 4 may include a control circuit for a switching element. The control circuit generates a drive command for operating the MOSFET 11, and outputs the drive command to the drive circuit. The control circuit generates the drive command in accordance with a torque request inputted from a upper electronic control unit (ECU), which is not shown) and with signals detected by various sensors. The various sensors are, for example, a current sensor, a rotation angle sensor, and a voltage sensor. The current sensor detects a phase current flowing in the winding 3a of each phase. The rotation angle sensor detects the rotation angle of a rotor of the motor generator 3. The voltage sensor detects a voltage across the smoothing capacitor 5. The control circuit outputs, for example, a pulse width modulation (PWM) signal as the drive command. The control circuit includes, for example, a microcomputer.

<Semiconductor Device>

Figure 2:
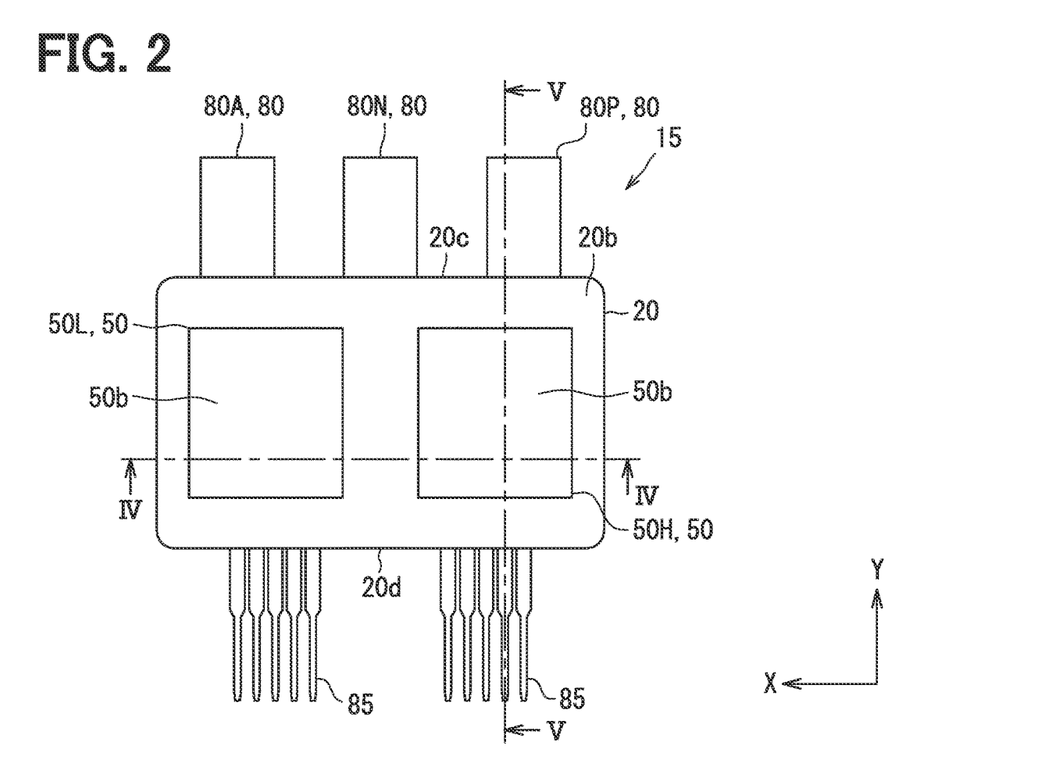
FIG. 2 is a plan view illustrating the semiconductor device according to the first embodiment.
Figure 3:
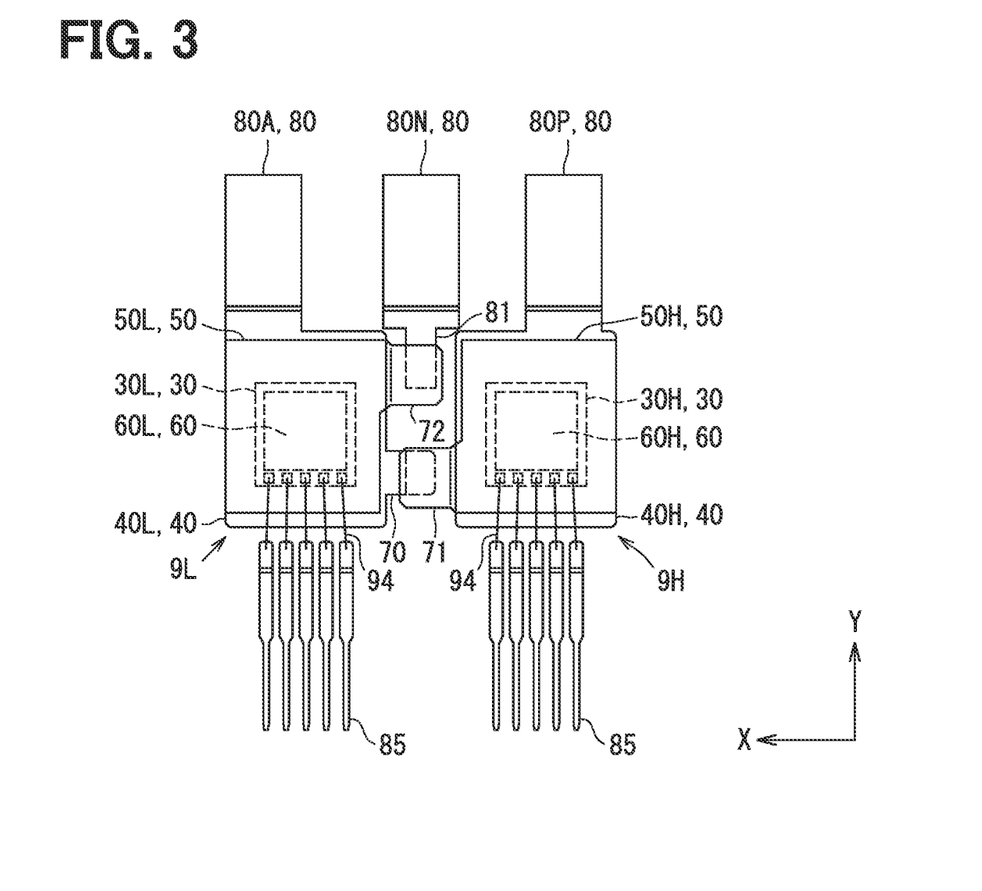
FIG. 3 is the plan view of the semiconductor device from which a sealing resin body is omitted.
Figure 4:
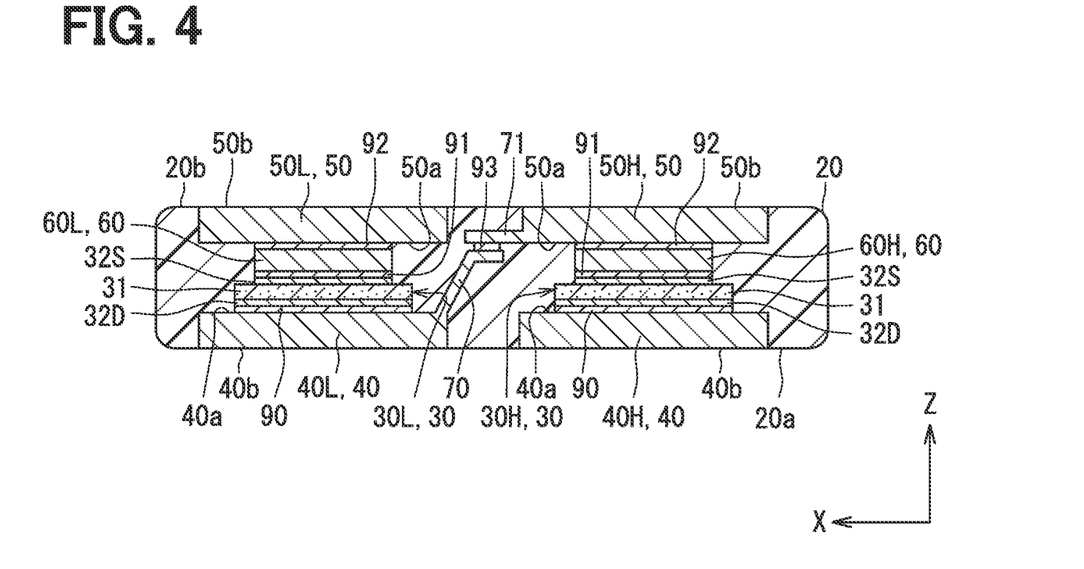
FIG. 4 is a cross-sectional view of the semiconductor device taken along line IV-IV in FIG. 2.
Figure 5:
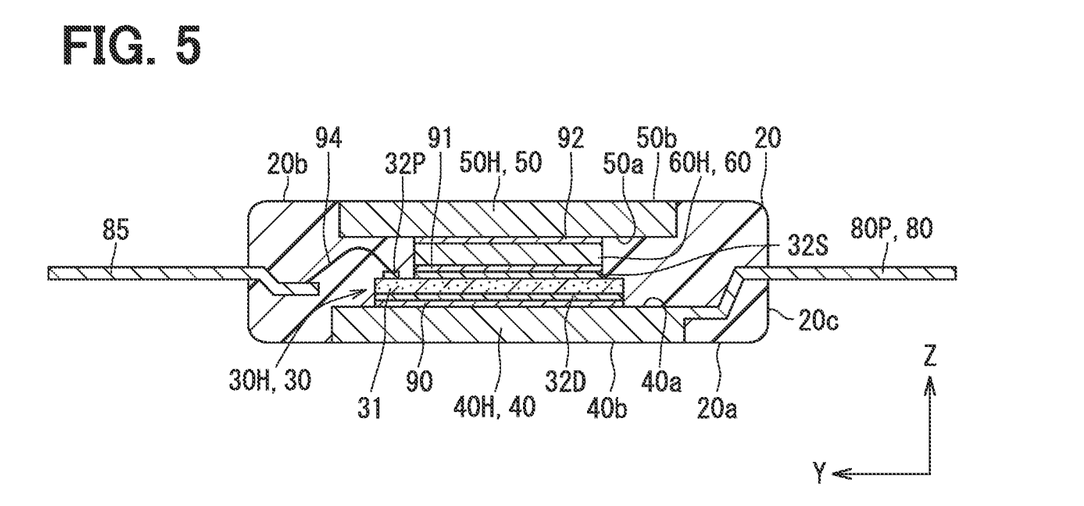
FIG. 5 is a cross-sectional view of the semiconductor device taken along line V-V in FIG. 2.

A configuration of the semiconductor device will now be outlined with reference to FIGS. 2 to 5. FIG. 2 is a plan view illustrating the semiconductor device. FIG. 3 is obtained by omitting a sealing resin body from FIG. 2 in order to illustrate the internal structure of the sealing resin body in the semiconductor device. FIG. 4 is a cross-sectional view taken along line IV-IV in FIG. 2. FIG. 5 is a cross-sectional view taken along line V-V in FIG. 2.

The reference numerals of some elements included in the semiconductor device are suffixed with "H" or "L." "H" denotes elements for the upper arm 9H, whereas "L" denotes elements for the lower arm 9L. Some other elements, for the sake of convenience, are designated by common reference numerals without distinguishing between the upper arm 9H and the lower arm 9L.

Further, the plate-thickness direction of a SiC substrate (semiconductor chip) is referred to as the Z-direction. A direction orthogonal to the Z-direction is referred to as the X-direction. A direction orthogonal to both the Z-direction and the X-direction is referred to as the Y-direction. Unless otherwise stated, a shape in a plan view in the Z-direction, that is, the shape along the X-Y plane defined by the X-direction and the Y-direction, is referred to as the planar shape. Furthermore, the plan view in the Z-direction is simply referred to as the plan view.

As illustrated in FIGS. 2 to 5, the semiconductor device 15 includes a sealing resin body 20, a semiconductor chip 30, heat sinks 40, 50, a terminal 60, couplings 70, 71, 72, a main terminal 80, and a signal terminal 85. The semiconductor device 15 configures one phase of the upper and lower arm circuit 9.

The sealing resin body 20 seals some portions of the other elements included in the semiconductor device 15. The remaining portions of the other elements are exposed from the sealing resin body 20. The material of the sealing resin body 20 is, for example, epoxy resin. The sealing resin body 20 is molded, for example, by a transfer mold method. As illustrated in FIG. 2, the sealing resin body 20 has a planar substantially rectangular shape. The sealing resin body 20 has one surface 20a and a rear surface 20b. The rear surface 20b is positioned opposite the one surface 20a in the Z-direction. The one surface 20a and the rear surface 20b are, for example, flat surfaces.

The semiconductor chip 30 is configured such that vertical elements are formed on a SiC substrate 31. The SiC substrate 31 is a semiconductor substrate made of silicon carbide (SiC). The semiconductor chip 30 may be referred to as a semiconductor element. The vertical elements are configured such that a main current flows in the Z-direction, that is, in the plate-thickness direction of the semiconductor chip 30 (SiC substrate 31). The vertical elements in the present embodiment are the MOSFET 11 and the diode 12, which form one arm. The diode 12 is a parasitic diode of the MOSFET 11. The diode 12 may be configured as a chip separate from the MOSFET 11.

A gate electrode, which is not shown, is formed on the SiC substrate 31. The gate electrode has, for example, a trench structure. The semiconductor chip 30 has a main electrode on each substrate surface of the SiC substrate 31. More specifically, the main electrode on one surface of the SiC substrate 31 is a drain electrode 32D, whereas the main electrode on the rear surface, that is, the surface opposite the one surface of the SiC substrate 31, is a source electrode 32S. The one surface of the SiC substrate 31 is a surface toward the one surface 20a of the sealing resin body 20. The drain electrode 32D serves also as a cathode electrode of the diode. The source electrode 32S serves also as an anode electrode of the diode. The drain electrode 32D corresponds to a first main electrode, and the source electrode 32S corresponds to a second main electrode.

The SiC substrate 31 (semiconductor chip 30) has a planar substantially rectangular shape. The semiconductor chip 30 has multiple pads 32P that are formed at positions different from the position of the source electrode 32S on the rear surface of the SiC substrate 31. The source electrode 32S and the pads 32P are both exposed from a protective film which is not shown. The drain electrode 32D is formed substantially on the whole of the one surface of the SiC substrate 31. The source electrode 32S is formed on a part of the rear surface of the SiC substrate 31. The source electrode 32S is formed corresponding to an active region where the vertical elements are formed. In the plan view, the drain electrode 32D has a larger area than the source electrode 32S. The source electrode 32S has a planar substantially rectangular shape.

The pads 32P are signal electrodes. The pads 32P are electrically isolated from the source electrode 32S. When viewed in the Y-direction, the pads 32P are formed at an end opposite the region where the source electrode 32S is formed. When viewed in the Y-direction, the pads 32P are arranged side by side with the source electrode 32S.

The pads 32P include gate electrode pads. The semiconductor chip 30 according to the present embodiment has five pads 32P. More specifically, the five pads 32P are a gate electrode pad, a pad for detecting the potential of the source electrode 32S, a pad for current sensing, a pad for the anode potential of a temperature sensing diode (temperature sensing element) for detecting the temperature of the semiconductor chip 30, and a pad for the cathode potential of the same temperature sensing diode. In the semiconductor chip 30 having a planar substantially rectangular shape, the five pads 32P are formed together toward one end in the Y-direction and side by side in the X-direction.

The semiconductor device 15 includes at least one semiconductor chip 30H that forms the upper arm 9H. Similarly, the semiconductor device 15 includes at least one semiconductor chip 30L that forms the lower arm 9L. The semiconductor device 15 according to the present embodiment includes one semiconductor chip 30H and one semiconductor chip 30L. In the semiconductor device 15, the two semiconductor chips 30H, 30L have the same configuration. The semiconductor chips 30H, 30L are arranged in the X-direction. The semiconductor chips 30H, 30L are disposed at substantially the same positions in the Z-direction.

The heat sink 40 is a heat dissipation member that dissipates heat generated by the semiconductor chip 30. The heat sink 40 is disposed toward one surface of the semiconductor chip 30 in the Z-direction, and connected to the drain electrode 32D. The heat sink 40 corresponds to a first heat dissipation member. The heat sink 40 is electrically connected to the drain electrode 32D, and configured to function also as a wiring member. The heat sink 40 has a facing surface 40a and a rear surface 40b. The facing surface 40a is a surface toward the semiconductor chip 30. The rear surface 40b is opposite the facing surface 40a. The heat sink 40 is connected to the semiconductor chip 30 through a solder 90. The solder 90 is disposed between the facing surface 40a of the heat sink 40 and the drain electrode 32D of the semiconductor chip 30 to form a solder joint part.

For example, a metal plate made of Cu or Cu alloy, a laminated plate formed by laminating a plurality of different metal layers, or a direct bonded copper (DBC) substrate may be adopted as the heat sink 40 (a first wiring member). The front surface of the heat sink 40 may be provided with a plating film made, for example, of Ni or Au. The heat sink 40 in the present embodiment is a metal plate made of Cu. The heat sink 40 is configured as a part of a lead frame. The heat sink 40 is a thick part of the lead frame, which is shaped like a deformed strip. The semiconductor device 15 includes two heat sinks 40. The semiconductor device 15 includes a heat sink 40H and a heat sink 40L. The heat sink 40H forms the upper arm 9H. The heat sink 40L forms the lower arm 9L.

As illustrated in FIG. 3, the heat sinks 40H, 40L have a planar substantially rectangular shape. The heat sinks 40H, 40L are arranged in the X-direction. The heat sinks 40H, 40L are substantially equal in thickness and disposed at substantially the same positions in the Z-direction. The solder 90 is disposed between the facing surface 40a of the heat sink 40H and the drain electrode 32D of the semiconductor chip 30H, and disposed between the facing surface 40a of the heat sink 40L and the drain electrode 32D of the semiconductor chip 30L.

In the plan view in the Z-direction, the heat sinks 40H, 40L contain the corresponding semiconductor chips 30. As illustrated in FIGS. 4 and 5, the rear surfaces of 40b of the heat sinks 40H, 40L are exposed from the sealing resin body 20. The rear surfaces 40b may be referred to as the heat dissipation surfaces or the exposed surfaces. The rear surfaces 40b are substantially flush with the rear surface 20b of the sealing resin body 20. The rear surfaces 40b of the heat sinks 40H, 40L are arranged in the X-direction.

The heat sink 50 and the terminal 60 are heat dissipation members that dissipate heat from the semiconductor chip 30. The heat sink 50 and the terminal 60 are disposed toward the rear surface of the semiconductor chip 30 in the Z-direction, and connected to the source electrode 32S. The heat sink 50 and the terminal 60 correspond to second heat dissipation members. The heat sink 50 and the terminal 60 are electrically connected to the source electrode 32S, and configured to serve also as wiring members. The heat sink 50 and the terminal 60 are connected to the source electrode 32S through solders 91, 92.

The heat sink 50 has a facing surface 50a and a rear surface 50b. The facing surface 50a is a surface toward the semiconductor chip 30 in the Z-direction. The rear surface 50b is opposite the facing surface 50a. The terminal 60 is disposed between the facing surface 50a of the heat sink 50 and the rear surface of the semiconductor chip 30. The terminal 60 is connected to the semiconductor chip 30 through the solder 91. The solder 91 is disposed between one end face of the terminal 60 and the source electrode 32S to form a solder joint part. The heat sink 50 is connected to the semiconductor chip 30 through the solder 92. The solder 92 is disposed between a surface opposite the one end face of the terminal 60 and the facing surface 50a of the heat sink 50 to form a solder joint part.

For example, a metal plate made of Cu or Cu alloy, a laminated plate formed by laminating a plurality of different metal layers, or a DBC substrate may be adopted as the heat sink 50. The front surface of the heat sink 50 may be provided with a plating film made, for example, of Ni or Au. The heat sink 50 in the present embodiment is a metal plate made of Cu. The semiconductor device 15 includes two heat sinks 50. The semiconductor device 15 includes a heat sink 50H and a heat sink 50L. The heat sink 50H forms the upper arm 9H. The heat sink 50L forms the lower arm 9L.

As illustrated in FIGS. 2 and 3, the heat sinks 50H, 50L have a planar substantially rectangular shape. The heat sinks 50H, 50L are arranged in the X-direction. The heat sinks 50H, 50L are substantially equal in thickness and disposed at substantially the same positions in the Z-direction. The heat sinks 50H, 50L contain the corresponding semiconductor chips 30 and the terminal 60. The rear surfaces 50b of the heat sinks 50H, 50L are exposed from the sealing resin body 20. The rear surfaces 50b may be referred to as the exposed surfaces. The rear surfaces 50b are substantially flush with the one surface 20a of the sealing resin body 20. The rear surfaces 50b of the heat sinks 50H, 50L are arranged in the X-direction.

The terminal 60 is positioned in the middle of a heat transfer path between the semiconductor chip 30 and the heat sink 50, and configured to transfer the heat generated by the semiconductor chip 30 to the heat sink 50. As mentioned earlier, the heat sink 50 in the present embodiment provides a wiring function with respect to the source electrode 32S. The terminal 60 is positioned in the middle of an electrical conduction path between the source electrode 32S and the heat sink 50. The terminal 60 may be referred to as the relay member. The terminal 60 functions as a spacer for providing a predetermined distance between the rear surface of the semiconductor chip 30 and the heat sink 50.

The terminal 60 is a metal body made of a single metal or a metal body (laminate) obtained by laminating a plurality of different metal layers. A clad material obtained by sequentially laminating a Cu layer and an alloy layer containing Cu may be adopted as the laminate. An alloy layer containing Al may be adopted instead of the alloy layer containing Cu. The alloy layer may contain Cr and Mo in addition to Cu and Al. The terminal 60 in the present embodiment is a columnar body having a planar substantially rectangular shape that is slightly smaller in size than the source electrode 32S in the plan view. The front surface of the terminal 60 may be provided with a plating film.

The semiconductor device 15 includes two terminals 60. The semiconductor device 15 includes a terminal 60H and a terminal 60L. The terminal 60H forms the upper arm 9H. The terminal 60L forms the lower arm 9L. The joint part is formed by the solder 91 between each of the terminals 60H, 60L and the source electrode 32S of corresponding semiconductor chips 30H, 30L. Similarly, the joint part is formed by the solder 92 between each of the terminals 60H, 60L and the facing surface 50a of the corresponding heat sinks 50H, 50L.

The couplings 70, 71 join the elements included in the upper and lower arm circuit 9. The coupling 72 joins the elements included in the semiconductor device 15. As illustrated in FIGS. 2 and 3, the coupling 70 is stretched to the heat sink 40L. The coupling 70 is thinner than the heat sink 40L. The coupling 70 is substantially flush with the facing surface 40a of the heat sink 40L and stretched to a lateral surface toward the heat sink 40H. The coupling 70 has two bends and is substantially shaped like a crank in the ZX plane. The coupling 70 is covered with the sealing resin body 20. The coupling 70 may be stretched by disposing the coupling 70 integrally with the heat sink 40L or may be provided as a separate member and stretched by connection. The coupling 70 in the present embodiment is disposed integrally with the heat sink 40L as a part of the lead frame.

The coupling 71 is stretched to the heat sink 50H. The coupling 71 is thinner than the heat sink 50H. The coupling 71 is substantially flush with the facing surface 50a of the heat sink 50H and stretched to a lateral surface toward the heat sink 50L. The coupling 71 is covered with the sealing resin body 20. The coupling 71 may be stretched by disposing the coupling 71 integrally with the heat sink 50H or may be provided as a separate member and stretched by connection. The coupling 71 in the present embodiment is disposed integrally with the heat sink 50H. A solder joint part is formed by disposing a solder 93 between the facing surface of the coupling 70 stretched to the heat sink 40L and the facing surface of the coupling 71 stretched to the heat sink 50H. The source electrode 32S of the semiconductor chip 30H and the drain electrode 32D of the semiconductor chip 30L are electrically connected to each other through the couplings 70, 71, the heat sinks 40L, 50H, and the terminal 60H.

The coupling 72 is stretched to the heat sink 50L. The coupling 72 is thinner than the heat sink 50L. The coupling 72 is substantially flush with the facing surface 50a of the heat sink 50L and stretched to a lateral surface toward the heat sink 50H. The coupling 72 is covered with the sealing resin body 20. The coupling 72 may be stretched by disposing the coupling 72 integrally with the heat sink 50L or may be provided as a separate member and stretched by connection. The coupling 72 in the present embodiment is disposed integrally with the heat sink 50L. The heat sink 50H including the coupling 71 and the heat sink 50L including the coupling 72 may be regarded as common members.

The main terminal 80 and the signal terminal 85 are external connection terminals. The main terminal 80 is electrically connected to the main electrode of the semiconductor chip 30. The main terminal 80 includes a positive electrode terminal 80P, a negative electrode terminal 80N, and an output terminal 80A. The positive electrode terminal 80P and the negative electrode terminal 80N are power supply terminals. The positive electrode terminal 80P is electrically connected to the positive electrode terminal of the smoothing capacitor 5. The negative electrode terminal 80N is electrically connected to the negative electrode terminal of the smoothing capacitor 5. The positive electrode terminal 80P may be referred to as the P terminal or the high-potential power supply terminal. The negative electrode terminal 80N may be referred to as the N terminal or the low-potential power supply terminal.

The positive electrode terminal 80P is stretched to the heat sink 40H, and electrically connected to the drain electrode 32D of the semiconductor chip 30H through the heat sink 40H. The positive electrode terminal 80P is stretched to one end in the Y-direction of the heat sink 40H. The positive electrode terminal 80P is thinner than the heat sink 40H. The positive electrode terminal 80P is substantially flush with the facing surface 40a and stretched to the heat sink 40H. The positive electrode terminal 80P may be stretched by disposing the positive electrode terminal 80P integrally with the heat sink 40H or may be provided as a separate member and stretched by connection. The positive electrode terminal 80P in the present embodiment is disposed integrally with the heat sink 40H as a part of the lead frame. The positive electrode terminal 80P is extended in the Y-direction from the heat sink 40H, and projected outward from a lateral surface 20c of the sealing resin body 20. The positive electrode terminal 80P has a bend in the middle of a portion covered with the sealing resin body 20, and is projected from the approximate center in the Z-direction of the lateral surface 20c.

The negative electrode terminal 80N is connected to the coupling 71, which is stretched to the heat sink 50L. The negative electrode terminal 80N is electrically connected to the source electrode 32S of the semiconductor chip 30L through the heat sink 50L and the terminal 60L. A solder joint part is formed by disposing solder, which is not shown, between the facing surface of the negative electrode terminal 80N and the facing surface of the coupling 71. The negative electrode terminal 80N is extended in the Y-direction, and projected to the outside of the sealing resin body 20 from the same lateral surface 20c as that of the positive electrode terminal 80P. The negative electrode terminal 80N has a connection 81 to the coupling 71 in the vicinity of one end in the Y-direction. A portion of the negative electrode terminal 80N including the connection 81 is covered with the sealing resin body 20, whereas the remaining portion is projected from the sealing resin body 20. The connection 81 is greater in plate thickness than the portion projected from the sealing resin body 20. The plate thickness of the connection 81 is approximately equal to the plate thickness of the heat sink 40. As is the case with the main terminal, the negative electrode terminal 80N has a bend, and is projected from the approximate center in the Z-direction of the lateral surface 20c. The negative electrode terminal 80N in the present embodiment is configured as a part of the lead frame.

The output terminal 80A is connected to the connection point between the upper arm 9H and the lower arm 9L. The output terminal 80A of the semiconductor device 15 is electrically connected to the winding 3a (stator coil) of a corresponding phase of the motor generator 3. The output terminal 80A may be referred to as the O terminal or the AC terminal. The output terminal 80A is stretched to one end in the Y-direction of the heat sink 40L. The output terminal 80A is thinner than the heat sink 40L. The output terminal 80A is substantially flush with the facing surface 40a, and stretched to the heat sink 40L. The output terminal 80A may be stretched by disposing the output terminal 80A integrally with the heat sink 40L or may be provided as a separate member and stretched by connection. The output terminal 80A in the present embodiment is disposed integrally with the heat sink 40L as a part of the lead frame.

The output terminal 80A is extended in the Y-direction from the heat sink 40L, and projected to the outside of the sealing resin body 20 from the same lateral surface 20c as that of the positive electrode terminal 80P. As is the case with the positive electrode terminal 80P, the output terminal 80A has a bend, and is projected from the approximate center in the Z-direction of the lateral surface 20c. The three main terminals 80 are arranged in the X-direction in order from the positive electrode terminal 80P to the negative electrode terminal 80N and the output terminal 80A.

The signal terminal 85 is electrically connected to a corresponding pad 32P of the semiconductor chip 30. In the present embodiment, the signal terminal 85 is electrically connected through a bonding wire 94. The signal terminal 85 is extended in the Y-direction, and projected outward from a lateral surface 20d of the sealing resin body 20. The lateral surface 20d is opposite the lateral surface 20c in the Y-direction. In the present embodiment, five signal terminals 85 are provided for each semiconductor chip 30. The signal terminals 85 are also included in the lead frame. The signal terminals 85 are electrically isolated from each other by cutting a tie bar, which is not shown.

As described above, the semiconductor device 15 is configured such that a plurality of semiconductor chips 30 forming one phase of upper and lower arm circuit 9 are sealed by the sealing resin body 20. The sealing resin body 20 integrally seals the semiconductor chips 30, a part of each of the heat sinks 40, a part of each of the heat sinks 50, the terminals 60, the couplings 70-72, and a part of each of the main terminals 80 and signal terminals 85.

When viewed in the Z-direction, the semiconductor chips 30 are disposed between the heat sinks 40, which are the first heat dissipation members, the heat sinks 50, which are the second heat dissipation members, and the terminals 60. The semiconductor chips 30 are sandwiched by the heat dissipation members. Therefore, the heat generated by the semiconductor chips 30 can be dissipated bilaterally in the Z-direction. The semiconductor device 15 has a double-sided heat dissipation structure. The rear surfaces 40b of the heat sinks 40 are substantially flush with the rear surface 20b of the sealing resin body 20. The rear surfaces 50b of the heat sinks 50 are substantially flush with the one surface 20a of the sealing resin body 20. Since the rear surfaces 40b, 50b are exposed, an enhanced heat dissipation capability is provided.

<Semiconductor Device Manufacturing Method>

An example method of manufacturing the above-described semiconductor device 15 will now be described.

First, the elements to be included in the semiconductor device 15 are prepared. For example, the lead frame is prepared. The lead frame includes the heat sinks (40H, 40L), the main terminals 80, and the signal terminals 85. Further, the semiconductor chips 30, the heat sinks 50, and the terminals 60 are prepared.

Next, the semiconductor chips 30 are disposed on the facing surfaces 40a of the heat sinks 40 through the solder 90. The solder 90, for example, is foil-shaped. Further, the terminals 60 (60H, 60L) whose surfaces are both pre-soldered are disposed on the source electrode 32S of the semiconductor chips 30 so that the solder 91 is disposed toward the semiconductor chips 30.

The semiconductor device 15 having a double-sided heat dissipation structure is sandwiched, for example, by coolers, which is not shown, between both surfaces in the Z-direction. Therefore, it is demanded that the surfaces be highly parallel to each other in the Z-direction and formed with high dimensional accuracy. Accordingly, the solder 92 is disposed in an amount that is capable of absorbing height variations of the semiconductor device 15. That is to say, an extra amount of solder 92 is disposed. Stated differently, the solder 92 thicker than the solders 90, 91 is disposed. Further, a solder is disposed on the coupling 70 and on the connection 81 of the negative electrode terminal 80N. Then, a first reflow is performed with the solders disposed as described above. As a result, a laminate integrally connected to the semiconductor chips 30, the heat sinks 40, and the terminals 60 is obtained.

Next, the heat sinks 50 (50H, 50L) are disposed on one surface of a base, which is not shown, in such a manner that the facing surfaces 50a are positioned upward. Next, the above-described laminate is disposed on the heat sinks 50 in such a manner that the solder 92 faces the heat sinks 50, and then a second reflow is performed. In the second reflow, a load is applied in the Z-direction from a side toward the heat sinks 40 in such a manner that the semiconductor device 15 has a predetermined height. For example, a load is applied in such a manner that a spacer, which is not shown, comes into contact with both the facing surfaces 40a of the heat sinks 40 and the one surface of the base. In this manner, the semiconductor device 15 has the predetermined height.

When the second reflow is performed, the laminate is integrated with the heat sinks 50 to form a connection structure. The solder 92 absorbs the height variations of the semiconductor device 15, which are caused due to dimensional tolerance and assembly tolerance of the elements included in the semiconductor device 15. When the second reflow is performed, the couplings 70, 71 are connected to each other. Further, the negative electrode terminal 80N is connected to the coupling 72.

After the connection structure is formed, the sealing resin body 20 is molded. In the present embodiment, the transfer mold method is adopted. The connection structure is disposed in a die to mold the sealing resin body 20. In the present embodiment, the sealing resin body 20 is molded so as to thoroughly cover the heat sinks 40, 50, and then machining is performed after molding. The sealing resin body 20 and some parts of the heat sinks 40, 50 are machined. As a result, the rear surfaces 40b, 50b are exposed from the sealing resin body 20. The rear surfaces 40b are substantially flush with the one surface 20a, and the rear surfaces 50b are substantially flush with the rear surface 20b.

Subsequently, the semiconductor device 15 is obtained by removing, for example, a tie bar, which is not shown.

The sealing resin body 20 may be molded while the rear surfaces 40b, 50b of the heat sinks 40, 50 are pressed against and closely attached to a cavity wall of a molding die. In this case, the rear surfaces 40b, 50b are exposed from the sealing resin body 20 at a time when the sealing resin body 20 is molded. Therefore, no machining needs to be performed after molding. Further, in the present example, a reflow operation is performed two times. However, the reflow operation need not always be performed two times. The connection structure may be formed by performing a single reflow operation.

<Lead-Free Solder>

Figure 6:
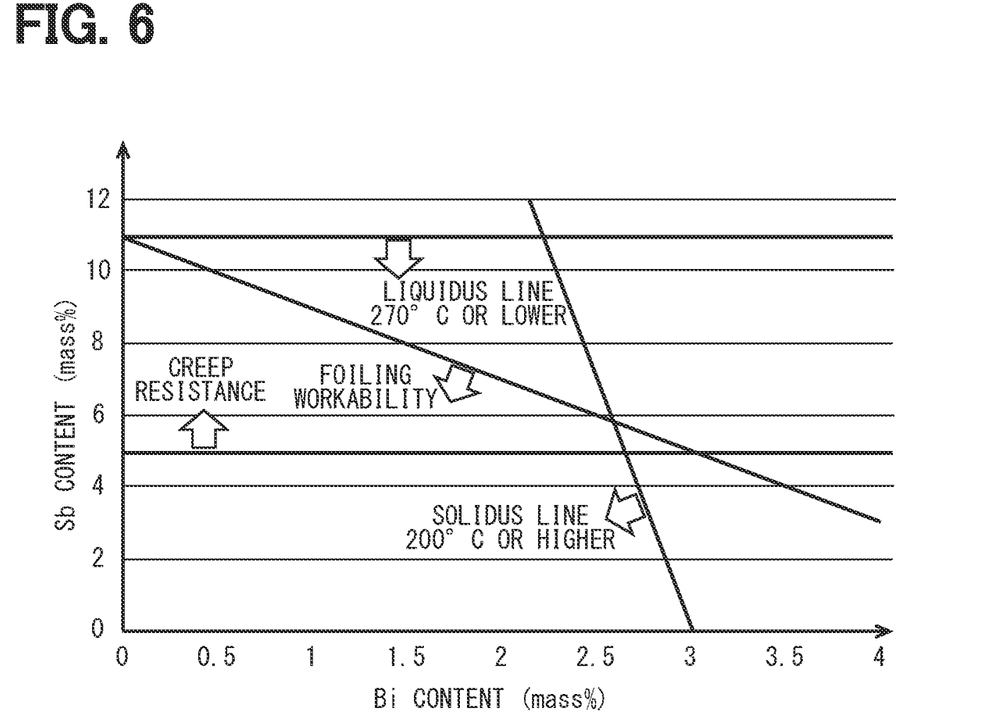
FIG. 6 is a diagram illustrating lead-free solder.

Lead-free solder used for the semiconductor device 15 will now be described. FIG. 6 is a diagram for explaining the lead-free solder. The vertical axis represents an Sb content x, whereas the horizontal axis represents a Bi content y.

The lead-free solder has an alloy composition that contains 3.2 to 3.8 mass % Ag, 0.6 to 0.8 mass % Cu, 0.01 to 0.2 mass % Ni, x mass % Sb, y mass % Bi, 0.001 to 0.3 mass % Co, 0.001 to 0.2 mass % P, and a balance of Sn. The Sb content x and the Bi content y satisfy relational expressions of $x+2y \leq 11$ mass %, $x+14y \leq 42$ mass %, and $x \geq 5.1$ mass %. As described above, the lead-free solder is an 8-element solder containing Ag, Cu, Ni, Sb, Bi, Co, P, and Sn. The lead-free solder having the above-described alloy composition may be referred to simply as the 8-element solder.

Addition of Ag is effective for providing improved solder wettability and for precipitation/dispersion strengthening of solder. However, excessive addition of Ag raises a liquidus temperature. When heat resistance of the semiconductor chips 30 (SiC) is taken into consideration, it is preferable that soldering is performed at a temperature of 300° C. or lower. Therefore, the Ag content is set to 3.2 to 3.8 mass % in order to obtain sufficient effects of wettability improvement and precipitation and dispersion, and maintain the liquidus temperature at 270° C. or lower as illustrated in FIG. 6 in consideration of variations as well.

Addition of Cu is effective for preventing Cu from eroded by a Cu land and for precipitating $Cu_6Sn_5$, which is a microscopic intermetallic compound, in a solder matrix for matrix strengthening. However, excessive addition of Cu precipitates an intermetallic compound at a bonding interface and accelerates crack development. Therefore, the Cu content is set to 0.6 to 0.8 mass %.

Addition of Ni is effective for miniaturizing the intermetallic compound precipitating at the bonding interface for bonding interface strengthening. However, excessive addition of Ni raises the liquidus temperature. The Ni content is set to 0.01 to 0.2 mass % in order to maintain the liquidus temperature at 270° C. or lower as described above.

Addition of Sb is effective for solute and precipitation strengthening and precipitation and dispersion strengthening and for replacing Sb with Sn to cause lattice distortion for Sn matrix strengthening. Bi, which is larger in atomic radius than Sb, is more effective for Sn matrix strengthening than Sb. However, if Sb or Bi is excessively contained, wettability and foiling workability will be reduced. In order to obtain wettability and workability compliant with Sn-13Sb, which permits foiling, the Sb content needs to be 11 mass % or lower in consideration of the influence exerted by the addition of 3.2 to 3.8 mass % Ag. Addition of Bi reduces the workability by a similar extent when the amount of addition of Bi is half the amount of addition of Sb. Therefore, the Sb content x and the Bi content y are set to satisfy a relational expression of $x+2y \leq 11$ mass % as illustrated in FIG. 6.

The effect of Sn matrix strengthening, which is produced by the addition of Sb and Bi, increases creep resistance. That is to say, the creep can be reduced. In order to obtain sufficient creep resistance, the present embodiment is configured to satisfy a relational expression of $x \geq 5.1$ mass % as illustrated in FIG. 6. Bi is more effective for reducing the creep than Sb. Addition of Bi produces substantially the same effect as the addition of Sb when the amount of addition of Bi is 1/4.4 the amount of addition of Sb. Therefore, Bi may be added by an amount smaller than Sb.

Further, in order to maintain connection reliability of solder, for example, in a molding process subsequent to soldering during the manufacture of the semiconductor device 15, it is preferable that a solidus temperature be 200° C. or higher as illustrated in FIG. 6. When the solidus temperature is 200° C., the Sn content x and the Bi content y can approximate to $x+14y=42$ in a region that satisfy the relational expression of $x \leq 15$ mass %. In order to maintain the solidus temperature at 200° C. or higher, the Sb content x and the Bi content y are set to satisfy a relational expression of $x+14y \leq 42$ mass %.

Co enhances the effect of Ni. Addition of Co is effective for miniaturizing the structure of a solder alloy. When the amount of addition is lower than 0.001 mass %, the intermetallic compound precipitates at the bonding interface and results in the failure to produce the effect of preventing crack growth. When the amount of addition exceeds 0.3 mass %, an intermetallic compound layer precipitates at the bonding interface becomes thicker to accelerate crack development. Therefore, the Co content is set to be 0.001 to 0.3 mass %.

P not only inhibits the oxidation of Sn but also provides improved wettability. When the P content is 0.2 mass % or lower, the fluidity of the solder alloy on a solder surface remains undisturbed. Meanwhile, in order to produce the above-described effect, the lower limit of the P content is preferably 0.001 mass % or higher. Therefore, the P content is set to be 0.001 to 0.2 mass %.

The lead-free solder (8-element solder) having the above-described composition is not only able to increase the life of a joint part formed by a solder while coping with a temperature rise in a usage environment, but also able to reduce unnecessary stress concentration on a part of each of the semiconductor chips due to creep. Therefore, the lead-free solder (8-element solder) is capable of operating at a high temperature, and suitable for the semiconductor chips 30 including the SiC substrate 31 having a high Young's modulus. The 8-element solder is a high-strength solder that has a tensile strength of 80 MPa or higher at room temperature.

Consequently, in the semiconductor device 15 according to the present embodiment, the 8-element solder is suitable for the solders 90, 91, 92, which are disposed between the semiconductor chips 30 and the heat dissipation members to form the joint parts. The 8-element solder is used as at least one of the solders 90, 91, 92. The solders 90, 91, 92 correspond to joining members. A position between the drain electrode 32D and the heat sinks 40 may be hereinafter referred to as a position below element. Similarly, a position between the source electrode 32S and the terminals 60 may be hereinafter referred to as a position above element. Further, a position between the terminals 60 and the heat sinks 50 may be hereinafter referred to as a position above terminal (above TML).

Figure 7:
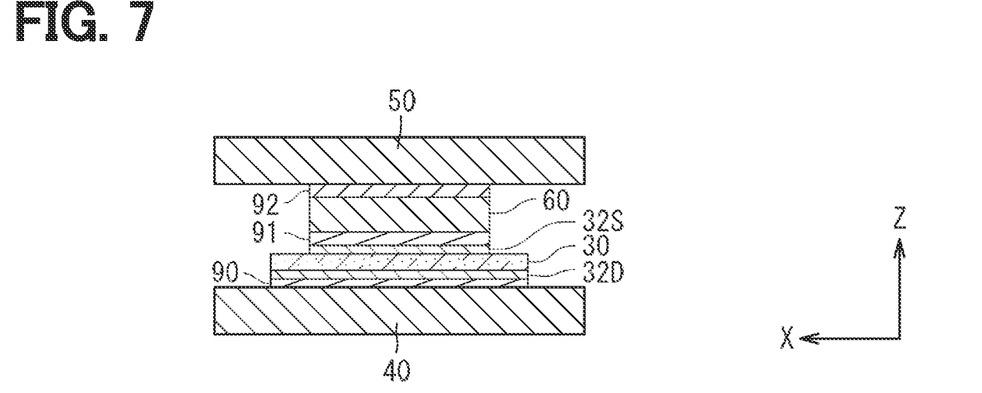
FIG. 7 is a cross-sectional view illustrating the location of the lead-free solder.

The 8-element solder should be used as at least one of the solder 90 below element and the solder 91 above element. Referring to FIG. 7, the 8-element solder is used as the solders 90, 91, and lead-free solder having a lower strength than the 8-element solder is used as the solder 92. FIG. 7 is obtained by simplifying the semiconductor device 15 illustrated in FIG. 4. FIG. 7 illustrates a structure common to the upper arm 9H and the lower arm 9L. Further, the sealing resin body 20 is omitted from FIG. 7.

When the 8-element solder is used as the solder 90, high connection reliability can be maintained even if thermal stress is applied based on the difference in the coefficient of linear expansion between the semiconductor chips 30 and the heat sinks 40. Similarly, when the 8-element solder is used as the solder 91, high connection reliability can be maintained even if thermal stress is applied based on the difference in the coefficient of linear expansion between the semiconductor chips 30 and the terminals 60. Further, electromigration (EM) and solder-plating diffusion can be suppressed at a position above element where the highest current density and temperature are reached.

When a power cycle test is performed, the solders 90, 91 in the vicinity of the semiconductor chips 30 may creep due to the high Young's modulus of the SiC substrate 31 and thus warp or otherwise deform the semiconductor chips 30 due to an increase in the number of cycles. Meanwhile, when the 8-element solder is used, the creep of the solders 90, 91 can be suppressed. As a result, the deformation of the semiconductor chips 30 can be suppressed to increase the life of the semiconductor device 15.

Figure 8:
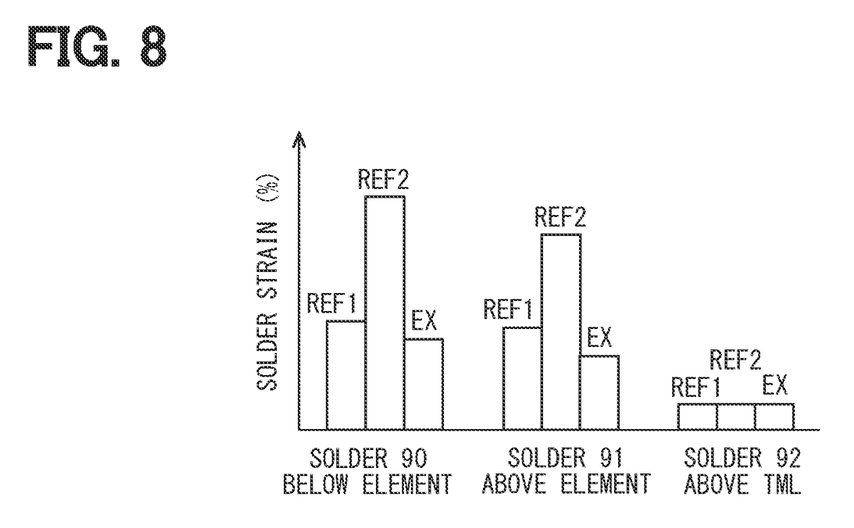
FIG. 8 is a diagram illustrating the result of simulation of solder strain.

The 8-element solder has excellent characteristics such as high creep resistance, and is thus effective for increasing the life of the whole semiconductor device 15 without regard to the structures of the heat sinks 40, 50 and terminals 60. FIG. 8 is a diagram illustrating the result of simulation of solder strain. Reference example 1 indicates a configuration that is obtained when lead-free solder having a lower strength than the 8-element solder is used for configuring a semiconductor chip that uses a Si substrate. Reference example 2 indicates a configuration that is obtained when the Si substrate illustrated in reference example 1 is replaced by a SiC substrate. A working example indicates a configuration that is obtained when the solder used in reference example 2 is replaced by the 8-element solder. In FIG. 8, reference example 1, reference example 2, the working example are denoted as REF1, REF2, and EX, respectively.

As indicated in reference examples 1 and 2, when Si is replaced by SiC, which has a higher Young's modulus than Si, the solder 90 below element and the solder 91 above element, which are positioned in the vicinity of the semiconductor chips 30, are affected by increased solder strain. However, when the 8-element solder is used, the solder strain imposed on each of the solders 90, 91 is reduced.

FIG. 7 illustrates an example in which a high-strength 8-element solder is used as each of the solders 90, 91. However, the present embodiment is not limited to such configuration. The 8-element solder may be used as only one of the solders 90, 91. As indicated in FIG. 8, when Si is replaced by SiC, the solder strain below element is maximized. Therefore, the 8-element solder should be used at least as the solder 90.

The 8-element solder may be used for the solder 92 above terminal. The semiconductor device 15 according to the present embodiment is structured so that the solder 92 absorbs the height variations of the semiconductor device 15. A solder having a low strength cracks due to increased solder stress when solder thickness decreases. Therefore, the solder thickness is designed to be sufficiently great. Since the life of the joint part can be increased by using the 8-element solder, the solder 92 can be designed to be thin. As a result, the semiconductor device 15 can be configured to have a low thermal resistance.

The 8-element solder may be used as both the solder 90 below element and the solder 92 above terminal. Since the 8-element solder has a high strength, the solder stress above terminal increases when the 8-element solder is used as the solder 90. The life of the joint part of the solder 92 above terminal can also be increased by using the 8-element solder as both the solder 90 and the solder 92.

The 8-element solder may be used as each of the solders 90, 91, 92. When such configuration is adopted, the reliability of the whole semiconductor device 14 can be enhanced. In the semiconductor device 15, the 8-element solder may be used as all the solders including the solders 90, 91, 92. For example, the 8-element solder may be used as the solder 93.

The above-described examples indicate a configuration where the semiconductor device 15 includes a plurality of semiconductor chips 30 forming one phase of upper and lower arm circuit 9. However, the present embodiment is not limited to such configuration. The semiconductor device 15 may include only a semiconductor chip 30 that forms one arm. For example, the semiconductor device 15 may include a semiconductor chip 30 forming one arm, a pair of heat sinks 40, 50 disposed so as to sandwich the semiconductor chip 30, and a terminal 60 disposed between the semiconductor chip 30 and the heat sink 50. Further, the semiconductor device 15 may include a semiconductor chip 30 forming a plurality of phases of upper and lower arm circuit 9 as a single package.

The above-described examples indicate a configuration where the signal terminals 85 are connected to the pads 32P through the bonding wire 94. However, the present embodiment is not limited to such configuration. For example, the signal terminals 85 may be connected to the pads 32P through the solders.

Second Embodiment

A second embodiment will now be described. The second embodiment is a modification that is obtained by using the preceding embodiment as a basic embodiment. Therefore, the description of the preceding embodiment can be incorporated herein by reference. The configurations of the main electrodes of the semiconductor chips 30 are not specifically described in conjunction with the preceding embodiment. The lead-free solder (8-element solder) having the earlier-described alloy composition need not always be used for the main electrodes made of the same materials, but may be used for the main electrodes having different configurations.

Figure 9:
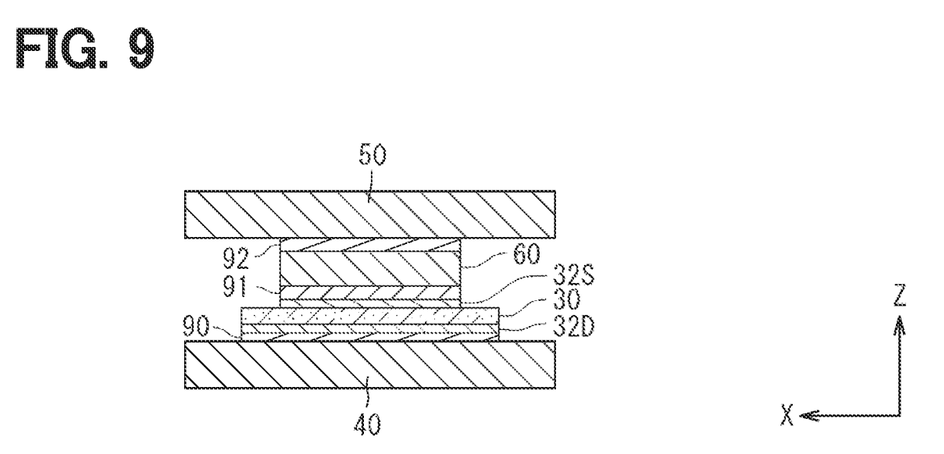
FIG. 9 is a cross-sectional view illustrating the location of a lead-free solder in a semiconductor device according to a second embodiment.

FIG. 9 is a cross-sectional view illustrating a part of the semiconductor device 15 according to the second embodiment. FIG. 9 corresponds to FIG. 7. In the present embodiment, the main electrode above element and the main electrode below element differ in material composition. The drain electrode 32D, which is the main electrode below element, is made, for example, of a TiNi material. The source electrode 32S, which is the main electrode above element, is made, for example, of an Al material. The source electrode 32S is made of a material having a lower Young's modulus, that is, a softer material, than the drain electrode 32D.

Figure 10:
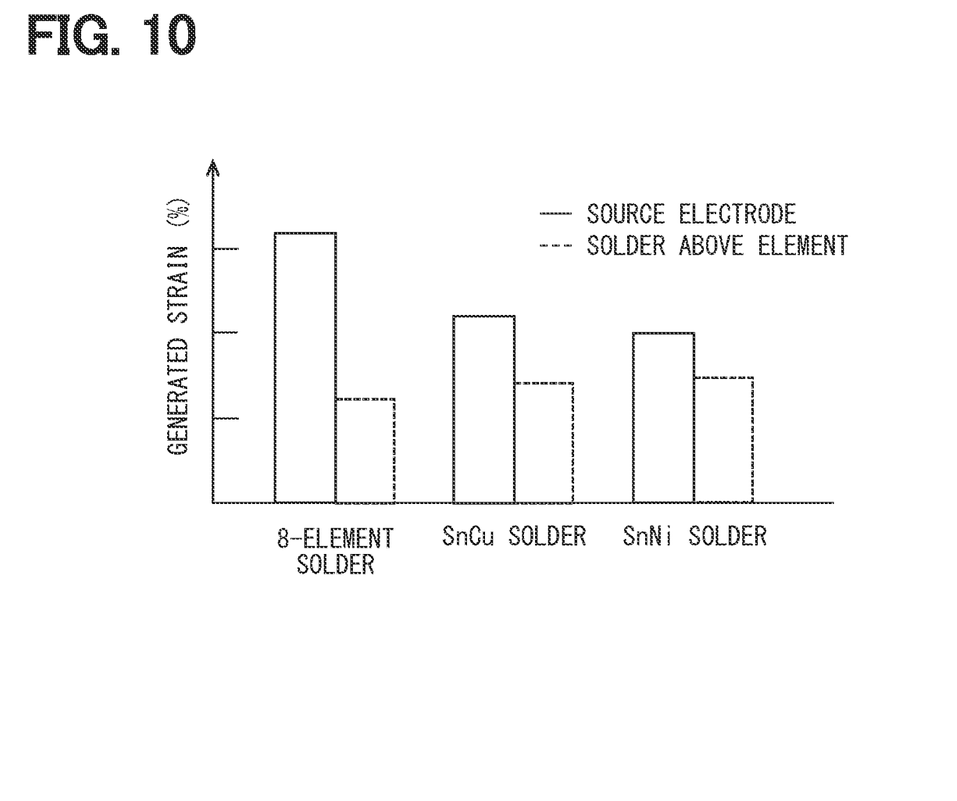
FIG. 10 is a diagram illustrating the result of simulation of strain that is generated in electrode and a solder above element.

FIG. 10 is a diagram illustrating the result of simulation of strain that is applied to the solder 91 above element and the source electrode 32S, which is the main electrode above element. FIG. 10 also illustrates the result obtained from a SnCu solder and a SnNi solder in addition to the 8-element solder. The SnCu solder and the SnNi solder are lead-free solders having a lower strength than the 8-element solder.

When the 8-element solder is used as the solder 91 above element, the strain generated in the solder 91 decreases as indicated in FIG. 10 because the 8-element solder has a high strength. Meanwhile, the strain generated in the source electrode 32S, which is soft, increases. When two types of solder having a lower strength than the 8-element solder are used, the strain generated in the solder 91 becomes greater than the strain generated in the 8-element solder, but the strain generated in the source electrode 32S becomes smaller than the strain generated in the 8-element solder.

In view of the above circumstances, as indicated in FIG. 9, the present embodiment uses the 8-element solder as the solder 90 disposed toward the hard drain electrode 32D and as the solder 92 above the terminal 60, and uses a lead-free solder having a lower strength than the 8-element solder as the solder 91 above the soft source electrode 32S. Since the solder 91 is softer than the solders 90, 92, the strain generated in the source electrode 32S can be decreased.

Figure 11:
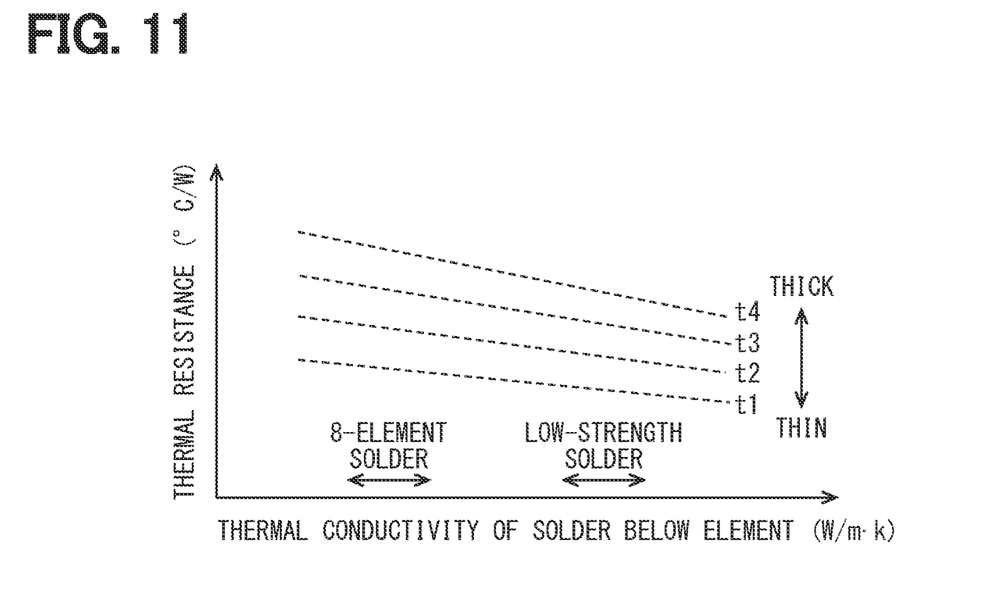
FIG. 11 is a diagram illustrating the relationship between solder thermal conductivity, solder thermal resistance, and solder thickness.

FIG. 11 is a diagram illustrating the result of simulation that indicates the relationship between the thermal conductivity, thermal resistance, and thickness of the solder 90 below element. FIG. 11 indicates four thickness levels (t1 to t4) as the thickness of the solder 90. The four thickness levels satisfy the relational expression $t1<t2<t3<t4$. As indicated in FIG. 11, the thermal conductivity of the 8-element solder is lower than the thermal conductivity of lead-free solder having a low strength. Therefore, when the 8-element solder is equal in thickness to the low-strength solder, the 8-element solder has a higher thermal resistance than the low-strength solder. Since the 8-element solder has a low thermal conductivity, the solder thickness of the 8-element solder should be decreased. When the 8-element solder has a thickness, for example, of 40 to 150 µm, it is possible to suppress an increase in the thermal resistance while producing the effects described in conjunction with the preceding embodiment. That is to say, an enhanced heat dissipation capability can be provided. The same holds true for the solder 92 above the terminal 60.

The present embodiment has been described on the assumption that the 8-element solder is used as both the solder 90 and the solder 92. However, the present embodiment is not limited to such configuration. The 8-element solder may be used as only one of the solders 90, 92.

Third Embodiment

A third embodiment will now be described. The third embodiment is a modification that is obtained by using the preceding embodiments as basic embodiments. Therefore, the descriptions of the preceding embodiments can be incorporated herein by reference. In the preceding embodiments, the heat sink 50 disposed toward the source electrode 32S provides the wiring function. However, an alternative configuration may be adopted so that the heat sink 50 does not provide the wiring function.

Figure 12:
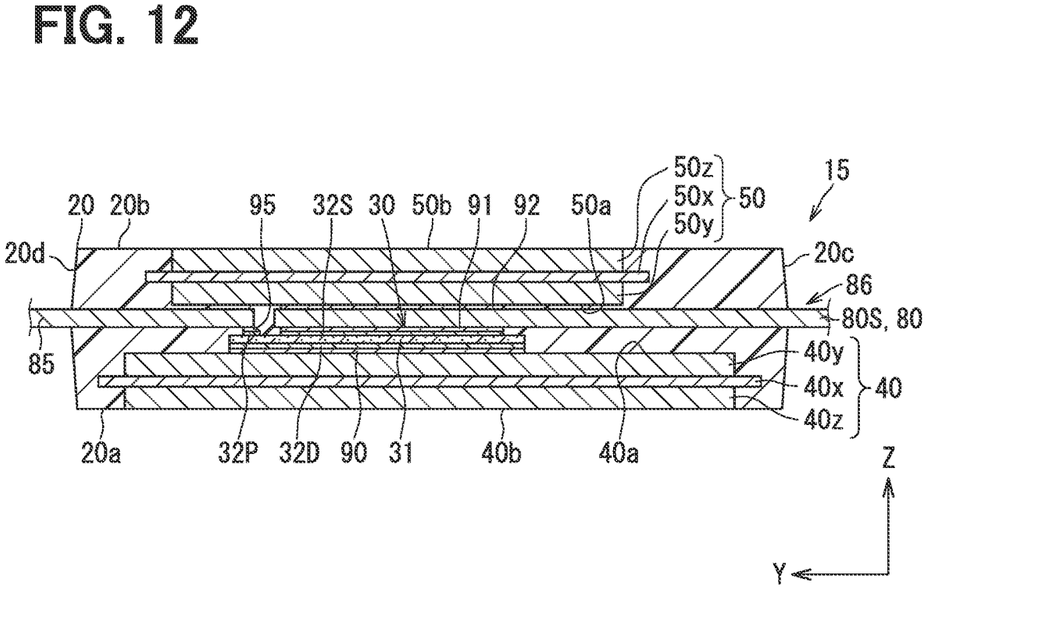
FIG. 12 is a cross-sectional view illustrating semiconductor device according to a third embodiment.

FIG. 12 is a cross-sectional view illustrating the semiconductor device 15 according to the third embodiment. In the present embodiment, the heat sinks 40, 50 adopt a DBC substrate instead of a metal plate. Further, a lead frame 86 is disposed between the semiconductor chip 30 and the heat sink 50 instead of the terminal 60. The heat sink 50 and the lead frame 86 correspond to the second heat dissipation member. The semiconductor device 15 forms one arm. That is to say, two semiconductor devices 15 form one phase of upper and lower arm circuit 9. The semiconductor device 15 according to the present embodiment includes only one semiconductor chip 30 that has the above-described configuration.

The heat sink 40 has an insulator 40x and metal bodies 40y, 40z. The metal bodies 40y, 40z are disposed so as to sandwich the insulator 40x. The insulator 40x is a ceramic substrate. The metal bodies 40y, 40z include, for example, Cu. The metal bodies 40y, 40z are directly joined to the insulator 40x. The heat sink 40 is configured such that the metal body 40y, the insulator 40x, and the metal body 40z are stacked in the order named from a side toward the semiconductor chip 30. The heat sink 40 has a three-layer structure.

In order to suppress warpage, the metal bodies 40y, 40z should preferably be substantially equal in planar shape and size. The insulator 40x, which is an intermediate layer, is similar in planar shape to the metal bodies 40y, 40z. The insulator 40x is larger in size than the metal bodies 40y, 40z. The whole circumference of the insulator 40x is extended beyond the outer circumference of the metal bodies 40y, 40z. In the heat sink 40, one surface of the metal body 40y serves as the facing surface 40a. In the heat sink 40, one surface of the metal body 40z serves as the rear surface 40b.

The heat sink 50 has the same configuration as the heat sink 40. The heat sink 50 has an insulator 50x and metal bodies 50y, 50z. The metal bodies 50y, 50z are disposed so as to sandwich the insulator 50x. The heat sink 50 is configured such that the metal body 50y, the insulator 50x, and the metal body 50z are stacked in the order named from the side toward the semiconductor chip 30. The heat sink 50 is disposed to face the heat sink 40 in the Z-direction. The heat sink 40, which is extended longer than the heat sink 50 in the Y-direction, has a facing area that faces the heat sink 50, and has a non-facing area that does not face the heat sink 50.

The lead frame 86 is configured as a member separate from the heat sinks 40, 50. The lead frame 86 is formed, for example, by performing press working on a metal plate made, for example, of Cu. The lead frame 86 includes the external connection terminals. The lead frame 86 includes the main terminal 80 and the signal terminal 85. The signal terminal 85 is connected to the corresponding pad 32P through a solder 95. The main terminal 80 includes a source terminal 80S and a drain terminal, which is not shown.

FIG. 12 illustrates a cross-section including the source terminal 80S. The drain terminal, which is not shown, is extended to a position in the heat sink that overlaps a non-facing area disposed opposite a side toward the signal terminal 85. The drain terminal is not extended to a position that overlaps the semiconductor chip 30. The drain terminal is connected to the above-described non-facing area of the metal body 40y of the heat sink 40. The drain terminal is electrically connected to the drain electrode 32D through the heat sink 40 (metal body 40y). The heat sink 40 provides the wiring function.

As illustrated in FIG. 12, the source terminal 80s is extended to a position that overlaps the semiconductor chip 30. The source terminal 80S is connected to the source electrode 32S through the solder 91. The metal body 50y of the heat sink 50 is connected to the source terminal 80S of the lead frame 86 through the solder 92. The source terminal 80S is electrically connected to the source electrode 32S, bypassing the heat sink 50. The heat sink 50 does not provide the wiring function, but provides a heat dissipation function.

The semiconductor device 15 having the above-described configuration may use the lead-free solder having the earlier-described alloy composition, which is described earlier, that is, the 8-element solder, as at least one of the solders 90, 91, 92. The 8-element solder can be disposed in a manner described in conjunction with the preceding embodiments. Therefore, the above-described configuration is able to produce the same effects as the configuration described in conjunction with the preceding embodiments.

The configuration described in conjunction with the present embodiment is not limited to the configuration of the semiconductor device 15 that configures one arm. For example, the configuration described in conjunction with the present embodiment is also applicable to the semiconductor device 15 that configures one phase of upper and lower arm circuit 9. When such an alternative configuration is adopted, the metal bodies 40y, 50y should be electrically isolated into a side toward the upper arm 9H and a side toward the lower arm 9L. The negative electrode terminal 80N is connected to the source electrode 32S of the semiconductor chip 30L through the solder 91, as is the case with the above-described source terminal 80S. The positive electrode terminal 80P is connected to the non-facing area of the metal body 40y disposed toward the upper arm 9H, as is the case with the drain terminal. The output terminal 80A may be connected, for example, to the non-facing area of the metal body 40y disposed toward the lower arm 9L, as is the case with the positive electrode terminal 80P. The output terminal 80A may be connected, for example, to the source electrode 32S of the semiconductor chip 30H through the solder 91, as is the case with the negative electrode terminal 80N. The upper and lower arms may be connected by connecting a part of the output terminal 80A to the metal body 40y disposed toward the lower arm 9L or connected by using separate members.

The above example assumes that the heat sinks 40, 50 adopt a DBC substrate. However, the present embodiment is not limited to such configuration. As is the case with the preceding embodiments, the heat sinks 40, 50 may adopt a metal plate.

Other Embodiments

The disclosure in this document including, for example, the accompanying drawings is not limited to the embodiments described above. The disclosure encompasses not only the above-described embodiments, but also embodiments modified by persons skilled in the art in accordance with the above-described embodiments. For example, the disclosure is not limited to combinations of parts and/or elements that are described in conjunction with the above-described embodiments. The disclosure can be implemented by various combinations. The disclosure may encompass additional parts that can be added to the above-described embodiments. The disclosure encompasses the above-described embodiments from which the parts and/or elements are omitted. The disclosure encompasses parts and/or elements that are obtained by replacement or combination between one of the above-described embodiments and another. The disclosed technical scope is not limited to the description of the above-described embodiments. It is to be understood by the persons skilled in the art that some areas of the disclosed technical scope encompass all changes that are described by the appended claims and within the scope of the appended claims and equivalents.

The disclosure in this document including, for example, the accompanying drawings is not limited to the appended claims. The disclosure in this document including, for example, the accompanying drawings encompasses technical ideas described in the appended claims, and covers a wider variety of technical ideas than the technical ideas described in the appended claims. Therefore, various technical ideas can be extracted from the disclosure in this document including, for example, the accompanying drawings without restricted by the definition in the appended claims.

In a case where an element or a layer is referred to as "disposed above," "coupled to," "connected to," or "united to," the element or the layer may be directly disposed above, coupled to, connected to, or united to another element or another layer, and additionally, an intervening element or layer may exist. By contrast, in a case where an element is referred to as "directly disposed above," "directly coupled to," "directly connected to," or "directly united to" another element or layer, no intervening element or layer exists. Other words used to explain the relationship between elements should be interpreted in a similar manner (e.g., "disposed between" or "directly disposed between" and "disposed adjacent to" or "directly disposed adjacent to"). When used in this document, the term "and/or" encompasses a certain combination or all combinations of one or more associated enumerated items.

Spatially relative terms, such as "inside," "outside," "back," "below," "lower," "above," and "higher," are used herein to make it easy to explain the relationship between an element or a feature and another element or another feature illustrated, for example, in the drawings. The spatially relative terms may be intended to encompass different orientations of a device in use or operation in addition to the orientations illustrated in the drawings. For example, if a device illustrated in the drawings is turned over, an element referred to as "below" or "directly below" another element or feature is oriented "above" the other element or feature. Therefore, the term "below" may encompass both an orientation of above and an orientation of below. The device may be otherwise oriented (rotated to an orientation of 90 or other degrees) so that spatially relative descriptors used in this document are interpreted accordingly.

The vehicle drive system 1 is not limited to the above-described configuration. For example, the above-described examples assume that the vehicle drive system 1 includes one motor generator 3. However, the number of motor generators is not limited to one. The vehicle drive system 1 may alternatively include a plurality of motor generators. Although the above-described examples assume that the power conversion device 4 includes the inverter 6 as a power conversion section, the power conversion device 4 is not limited to such configuration. The power conversion device 4 may alternatively include a plurality of power conversion sections. For example, the power conversion device 4 may be configured to include a plurality of inverters. The power conversion device 4 may include at least one inverter and the converter.

The above-described examples assume that the MOSFET 11 is used as an element formed on the SiC substrate 31 of the semiconductor chip 30. However, the element is not limited to a MOSFET. Any vertical element applicable to the power conversion device may be used. For example, an insulated gate bipolar transistor (IGBT) or a Schottky barrier diode (SBD) is also applicable. Although the above-described examples assume that the MOSFET 11 is formed as the vertical element, the vertical element is not limited to a MOSFET. Any vertical element that allows a current to flow between the main electrodes on both surfaces may be used. For example, an IGBT may be used.

The above-described examples assume that one arm is configured by using one semiconductor chip 30. However, an alternative configuration may be adopted. For example, a plurality of semiconductor chips 30 may be connected in parallel to configure one arm.

The above-described examples assume that the rear surfaces 40b, 50b of the heat sinks 40, 50 are exposed from the sealing resin body 20. However, the heat sinks 40, 50 are not limited to such configuration. The heat sinks 40, 50 may alternatively be configured such that at least one of the rear surfaces 40b, 50b is covered with the sealing resin body 20. At least one of the rear surfaces 40b, 50b may be covered with an insulating member (not shown) that is separate from the sealing resin body 20. Although the above-described examples assume that the semiconductor device 15 includes the sealing resin body 20, the semiconductor device 15 may alternatively be configured without including the sealing resin body 20.

The above-described examples assume that the upper arm 9H and the lower arm 9L are connected with the couplings 70, 71 in a configuration where the semiconductor device 15 forms one phase of upper and lower arm circuit 9. However, the semiconductor device 15 is not limited to such configuration. The semiconductor device 15 may alternatively be configured to include only one of the couplings 70, 71. For example, the coupling 70 may be connected to the heat sink 50H.

The above-described examples assume that the SiC substrate 31 is used as a semiconductor substrate for configuring the semiconductor chip 30. However, a semiconductor substrate having a higher Young's modulus than Si may alternatively be used instead of the SiC substrate 31.

Figure 13:
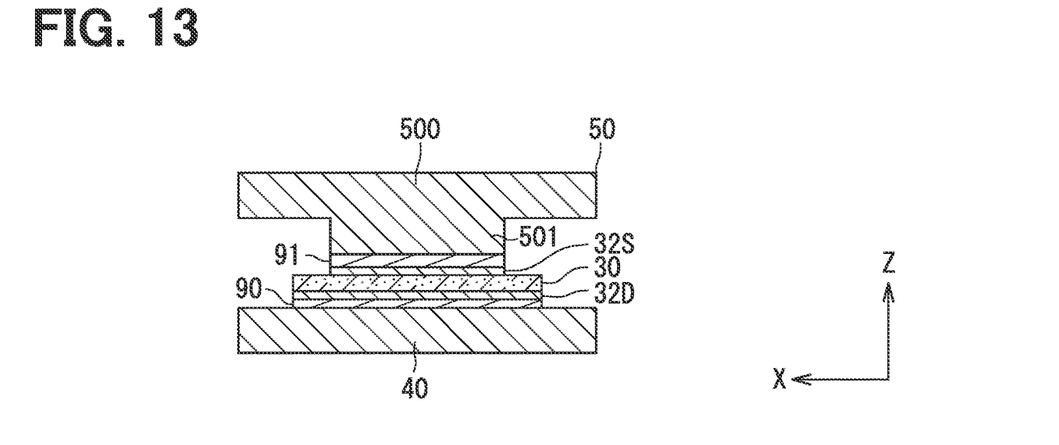
FIG. 13 is a cross-sectional view illustrating a modification.

The above-described examples assume that the terminal 60 is disposed between the heat sink 50 and the semiconductor chip 30 in a configuration where the heat sink 50 functions as a wiring member. However, the heat sink 50 is not limited to such configuration. As indicated, for example, by a modification illustrated in FIG. 13, the heat sink 50 may be configured to include a main body section 500 and a convex section 501. The convex section 501 is projected from a surface of the main body section 500 that is positioned toward the semiconductor chip 30. The tip surface of the convex section 501 is connected to the source electrode 32S through the solder 91. As indicated above, an alternative configuration may be adopted such that the second heat dissipation member includes only the heat sink 50. When this alternative configuration is adopted, the solder 92 can be excluded. The lead-free solder having the above-described alloy composition should preferably be used as at least one of the solders 90, 91, which are disposed between the semiconductor chip 30 and the heat dissipation member.

What is claimed is:

1. A semiconductor device comprising:
a semiconductor chip that includes
   a silicon carbide substrate in which an element is formed,
   a first main electrode disposed on one surface of the silicon carbide substrate, and
   a second main electrode disposed on a rear surface of the silicon carbide substrate, the rear surface positioned opposite the one surface in a plate thickness direction of the silicon carbide substrate;
a first heat dissipation member and a second heat dissipation member disposed so as to sandwich the semiconductor chip, the first heat dissipation member disposed toward the one surface and connected to the first main electrode, the second heat dissipation member disposed toward the rear surface and connected to the second main electrode; and
a plurality of joining members including a joining member disposed between the first main electrode and the first heat dissipation member and a joining member disposed between the second main electrode and the second heat dissipation member, wherein
at least one of the plurality of joining members is made of a lead-free solder having an alloy composition that contains 3.2 to 3.8 mass % Ag, 0.6 to 0.8 mass % Cu, 0.01 to 0.2 mass % Ni, x mass % Sb, y mass % Bi, 0.001 to 0.3 mass % Co, 0.001 to 0.2 mass % P, and a balance of Sn, where x and y satisfy relational expressions of $x+2y \leq 11$ mass %, $x+14y \leq 42$ mass %, and $x \geq 5.1$ mass %,
the second main electrode is made of a material having a lower Young's modulus than the first main electrode, and
the joining member disposed between the first main electrode and the first heat dissipation member is made of the lead-free solder, and the joining member disposed between the second main electrode and the second heat dissipation member is made of a low-strength solder having a lower strength than the lead-free solder.

2. The semiconductor device according to claim 1, wherein
the second heat dissipation member includes a terminal and a heat sink, the terminal being connected to the second main electrode, the heat sink being electrically connected to the second main electrode through the terminal,
the joining member disposed between the second main electrode and the second heat dissipation member is disposed between the second main electrode and the terminal,
the plurality of joining members further includes a joining member disposed between the terminal and the heat sink, and
the joining member disposed between the second main electrode and the terminal is made of the low-strength solder.

3. The semiconductor device according to claim 1, wherein
the semiconductor device includes a transistor,
the first main electrode is a first transistor electrode for the transistor, and
the second main electrode is a second transistor electrode for the transistor.

4. The semiconductor device according to claim 1, wherein
the semiconductor device includes a MOSFET transistor,
the first main electrode is a drain electrode for the MOSFET transistor, and
the second main electrode is a source electrode for the MOSFET transistor.

* * * * *